United States Patent [19]
Williams et al.

[11] Patent Number: 5,517,379
[45] Date of Patent: May 14, 1996

[54] REVERSE BATTERY PROTECTION DEVICE CONTAINING POWER MOSFET

[75] Inventors: Richard K. Williams, Cupertino; Thomas Toombs, Los Altos; King Owyang, Atherton; Hamza Yilmaz, Saratoga, all of Calif.

[73] Assignee: Siliconix incorporated, Santa Clara, Calif.

[21] Appl. No.: 67,373

[22] Filed: May 26, 1993

[51] Int. Cl.⁶ .................................................. H02H 9/00
[52] U.S. Cl. .................... 361/84; 361/58; 307/127
[58] Field of Search .................... 361/84, 88, 82, 361/77, 58, 91, 93, 100, 101; 307/127, 303, 304, 10.6, 10.7, 130, 138; 340/635, 636; 327/564, 581

[56] References Cited

U.S. PATENT DOCUMENTS

| | | | |
|---|---|---|---|
| 4,680,516 | 7/1987 | Guzik et al. | 318/326 |
| 4,808,839 | 2/1989 | Dunn et al. | 361/91 |
| 4,835,649 | 5/1989 | Salerno | 361/79 |
| 4,857,985 | 8/1989 | Miller | 361/82 |
| 4,992,683 | 2/1991 | Robin, Jr. | 307/120 |
| 5,109,162 | 4/1992 | Koch et al. | 361/84 |
| 5,181,091 | 1/1993 | Harrington, III et al. | 257/355 |
| 5,229,633 | 7/1993 | Fisher et al. | 257/339 |
| 5,516,989 | 10/1992 | Williams et al. | 437/77 |

*Primary Examiner*—A. D. Pellinen
*Assistant Examiner*—Ronald W. Leja
*Attorney, Agent, or Firm*—Skjerven, Morrill, MacPherson, Franklin & Friel; David E. Steuber

[57] ABSTRACT

A device for protecting battery-powered semiconductor devices and the like against a reverse battery condition. During normal operation a charge pump charges the gate of a power MOSFET, turning the MOSFET on and providing a low-resistance power supply path from the battery to the load. If the battery is reversed, a depletion mode device shorts the gate and source of the MOSFET, turning it off and disconnecting the load from the battery.

11 Claims, 7 Drawing Sheets

REVERSE BATTERY PROTECTION DEVICE CONTAINING POWER MOSFET

FIELD OF THE INVENTION

This invention relates to a device for protecting integrated circuits and other semiconductor devices against damage when the battery by which they are powered is connected in reverse. In particular, this invention relates to a device for protecting integrated circuit devices in a motor vehicle against damage from a reverse-connected battery.

BACKGROUND OF THE INVENTION

The introduction of integrated circuit (IC) and semiconductor devices to motor vehicles has greatly increased the control capability available to the designer. At the same time, however, it has created a need to protect these components against a reverse-connected battery. Many IC devices, such as microcomputers, contain a diode connected between the supply voltage and ground. If the battery is properly connected (i.e., with the negative terminal connected to chassis ground) these diodes are reverse-biased. When the battery is reversed, however, these diodes become forward-biased, and minority carriers may be injected throughout the device. The resulting high currents may lead to thyristor action, snap-back, latch-up or other consequences that will almost certainly destroy the device. Thus, all such devices must be protected against a reverse-connected battery.

In many motor vehicles a Schottky diode is connected in series with the load and oriented so that it is forward-biased when the battery is properly connected. If the battery is reversed, the diode becomes reverse-biased and the loads are protected from reverse currents or negative voltages. A disadvantage of this technique is that, during normal operation, a voltage drop exists across the forward-biased diode and heat energy is generated. For example, a 60 volt Schottky diode might generate a 0.8 volt drop, and with a current flow of 20 amps about 16 watts of heat energy would be generated. This heat not only represents lost energy but must be transferred away from the diode to avoid excessive temperatures. Heat sinks are becoming more difficult to find in motor vehicles, however, because more parts are being made of plastic. The metal surfaces in the engine compartment are generally too hot to serve as heat sinks.

The most attractive solution to this problem would be a device which approximates as closely as possible an ideal diode, with an equivalent resistance in the forward direction of no more than 50 milliohms. One possibility would be to connect a low on-resistance N-channel power MOSFET in series with the load, with its source connected to the battery and its drain connected to the load. Properly driven, during normal operation the power MOSFET's low resistance channel would shunt any current away from the intrinsic source-body diode, producing a low on-state voltage drop. When the battery is reversed, the MOSFET would be shut off, leaving the intrinsic drain-to-body diode reverse-biased. However, to turn the MOSFET on with a low resistance, its gate must be biased at least 8 volts above its source, which is connected to the battery. A charge pump or similar means is necessary to produce a gate-source voltage of a magnitude sufficient to guarantee that the MOSFET will be fully turned on.

If a semiconductor device is used to provide the gate-source voltage, this device is susceptible to the same reverse-battery problems as the other devices in the motor vehicle. That is, if the gate driver is connected directly to the battery's positive and negative terminals (i.e., between the vehicle's "hot" and ground terminals), it will be subjected to a reverse potential if the battery is hooked up in reverse. In many self-isolated and junction-isolated IC technologies, a reverse battery connection will forward-bias many junctions in the IC, flood the substrate with minority carriers, or cause latch-up, excessive heating or other undesirable effects.

The electrical systems in motor vehicles experience transient voltages which typically vary between +60 V and −60 V. A protective device must also be able to withstand these transient voltages.

SUMMARY OF THE INVENTION

In accordance with this invention, a power MOSFET is connected in series with a load. The source of the MOSFET is connected to a battery or other power source; the drain is connected to the load. The gate of the MOSFET is driven by a charge pump control IC in combination with a depletion mode MOSFET, both of which are capable of surviving a reverse-connected battery as well as positive or negative voltage transients of 60 V or more. The depletion mode MOSFET, which in the preferred embodiment is a discrete device, is connected across the source and gate terminals of the power MOSFET. When the battery is properly connected, the charge pump biases the gate of the power MOSFET so as to turn it on, and the depletion mode MOSFET is turned off. The drain-body diode of the power MOSFET is shunted out by its channel, and it provides a low on-resistance which may be 50 milliohms or less. When the battery is reversed, the depletion mode MOSFET is turned on. This shorts the gate and source of the power MOSFET, thereby turning the power MOSFET off. Its body-drain diode is reverse-biased, and this prevents a reverse current flow in the system.

The gate driver is protected against a reverse voltage and transient voltages by using a unique junction-isolated diode as a component of the charge pump. The charge pump, together with the other components of the gate driver, is advantageously formed on a single IC. In a preferred embodiment, the diode is an N+ to P-body diode in a P-type expitaxial layer, surrounded by a wraparound N+ junction isolation region. The potential of the isolation region is determined by a thick gate CMOS inverter whose gate is driven by the diode's cathode. The P-type substrate of the IC is grounded. The CMOS inverter is arranged in such a way that, regardless of the voltage at the cathode of the diode, no junction ever becomes forward-biased into the grounded P-type substrate.

In accordance with another aspect of this invention, a sensing device detects when the voltage of the battery (properly connected) falls to the point where the power MOSFET is not fully turned on. The sensing device generates a signal which causes an appropriate corrective action to be taken—for example, switching off all or a portion of the load connected to the output of the reverse battery protection circuit.

DESCRIPTION OF THE INVENTION

Figure 1A:
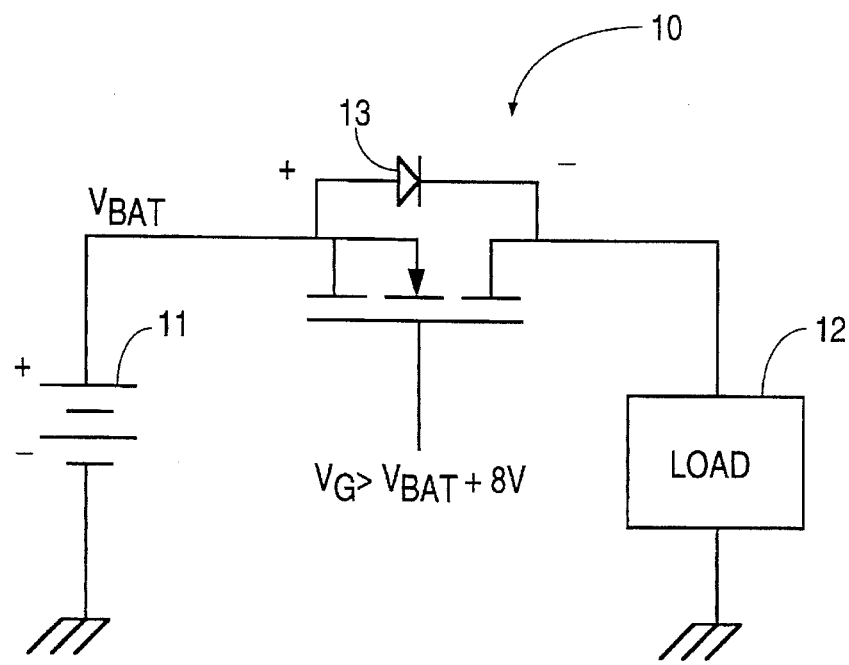
FIGS. 1A and 1B illustrate schematically a power MOSFET according to this invention, in normal operation and in reverse-battery operation, respectively.
Figure 1B:
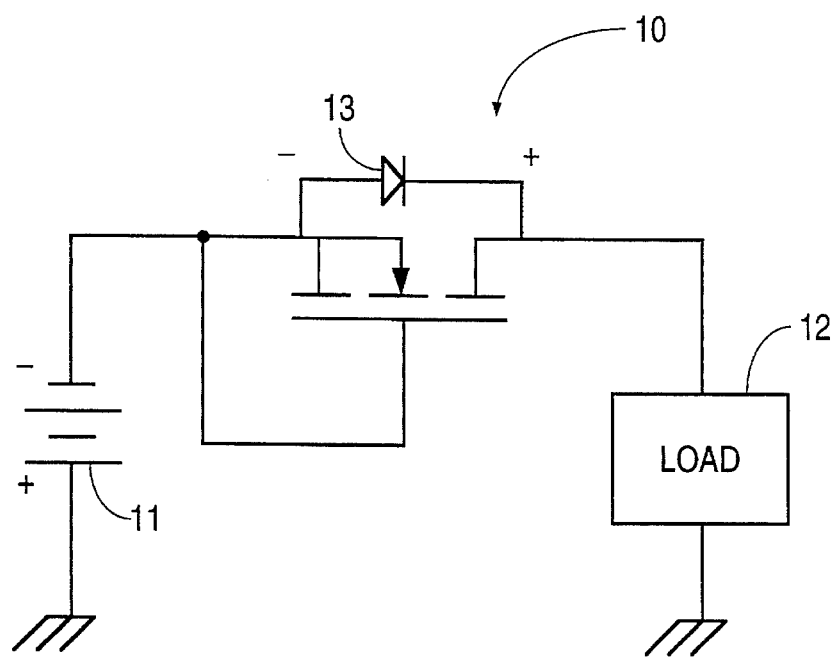

FIGS. 1A and 1B show a power MOSFET 10 connected in series between a battery 11 and a load 12. MOSFET 10 is an N-channel power MOSFET such as the SMP60N06-18 manufactured by Siliconix, Inc. A diode 13 represents the body to drain diode in MOSFET 10. Load 12 represents the entire load of, for example, an automobile electrical system, including all active devices, switches, and protective devices. Load 12 may contain, for example, diodes or other elements for protecting various components against large positive or negative voltage transients. These elements operate in conjunction with power MOSFET 10, which protects the various electronic components in the load against a reversed battery condition.

FIG. 1A shows MOSFET 10 in normal operation, with its source connected to the positive terminal of battery 11 and its drain connected to load 12. The negative terminal of battery 11 is connected to ground; its positive terminal provides a voltage $V_{BAT}$. To ensure that MOSFET 10 is turned on, its gate terminal must be maintained at a voltage $V_G$ which is at least 8 volts above $V_{BAT}$. In this situation, current flows through the N-channel of MOSFET 10, which is a very low resistance path, and diode 13 is effectively shunted out.

FIG. 1B illustrates MOSFET 10 when battery 11 has been connected in reverse. The gate and source of MOSFET 10 have been shorted ($V_{GS}=0$) and MOSFET 10 has therefore been turned off. Diode 13 is reverse-biased, and accordingly there is practically no current flow through MOSFET 10. The entire voltage drop of battery 10 is therefore sustained by MOSFET 10, and the various devices within load 12 are protected against the reverse potential.

Figure 2:
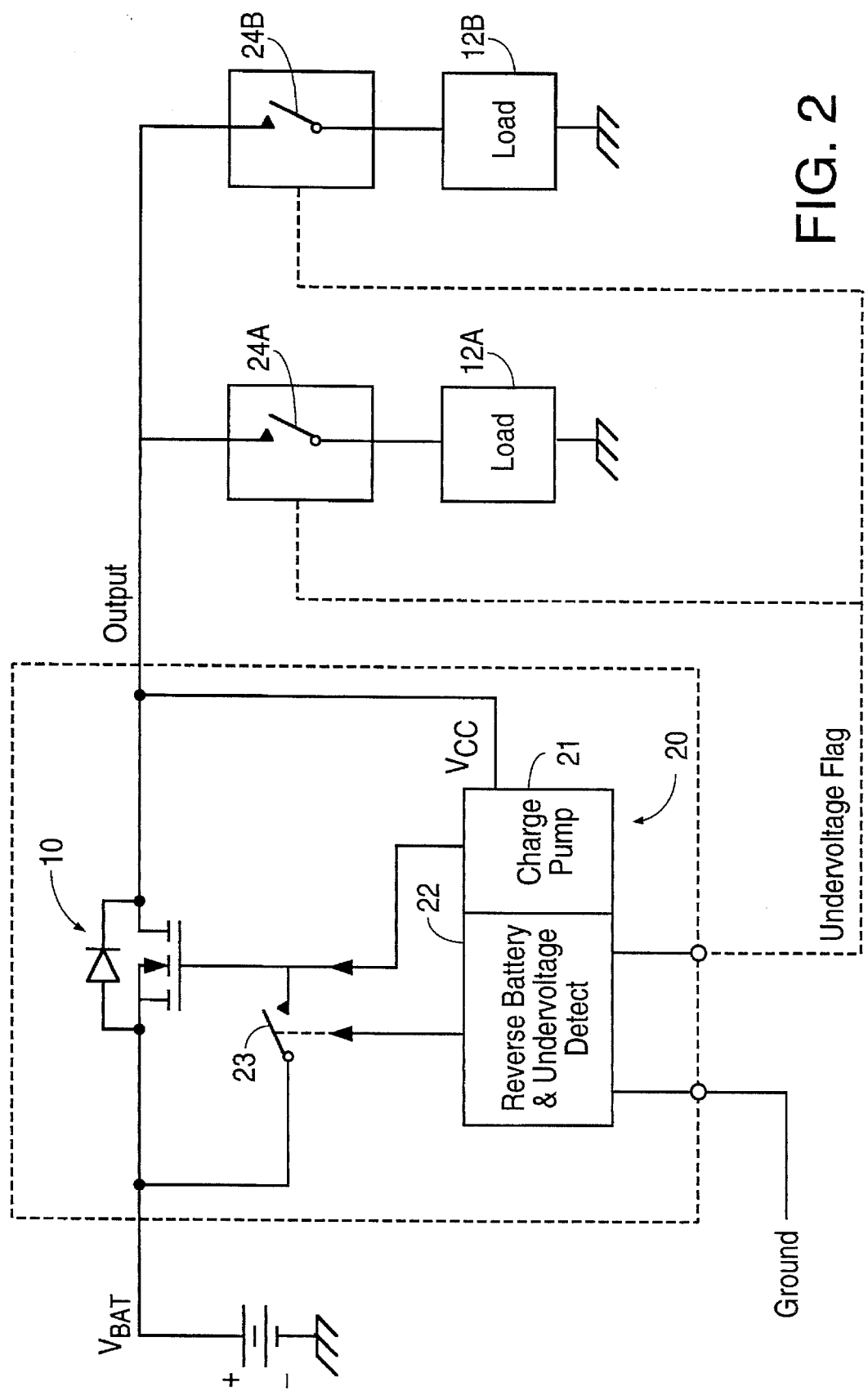
FIG. 2 illustrates a block diagram of an arrangement according to this invention, showing schematically a depletion mode device, a charge pump, and an under voltage detector.

FIG. 2 illustrates a control IC chip 20 which includes a charge pump 21 and a reverse battery and undervoltage detection circuit 22. A discrete depletion mode MOSFET 23 is illustrated schematically as a switch between the source and gate of power MOSFET 10. Charge pump 21 is powered from the "protected" side of power MOSFET 10, i.e., the side which is disconnected from battery 11 when MOSFET 10 is open. An output of reverse battery and undervoltage detection circuit 22 runs to switches 24A and 24B which link respective components 12A and 12B of load 12 to the output of MOSFET 10. Another output of circuit 22 is connected to depletion mode MOSFET 23. The depletion mode MOSFET does not require a charge pump to operate. As explained below, when circuit 22 detects that the battery has been connected in reverse, it closes (i.e., turns on) depletion mode MOSFET 23, thereby shorting the source and gate of power MOSFET 10. This in turn switches MOSFET 10 to an off condition, and MOSFET 10 acts as an open switch preventing load 12 from experiencing a reverse current or voltage. In this way it protects load 12 from a reverse-connected battery.

When the output of battery 11 falls below about 6 V, charge pump 21 may not be able to maintain an adequate gate-source voltage $V_{GS}$ sufficient to keep MOSFET 10 fully turned on. As a result, the on-resistance and heat generated by MOSFET 10 may increase. Circuit 22 senses this condition and turns off one or more of switches 24A and 24B until the current flow in the circuit is reduced to a safe level. Circuit 22 is of known design and may contain, for example, a comparator having one input connected to a reference voltage and the other input connected to a voltage divider supplied by $V_{BAT}$.

Figure 3:
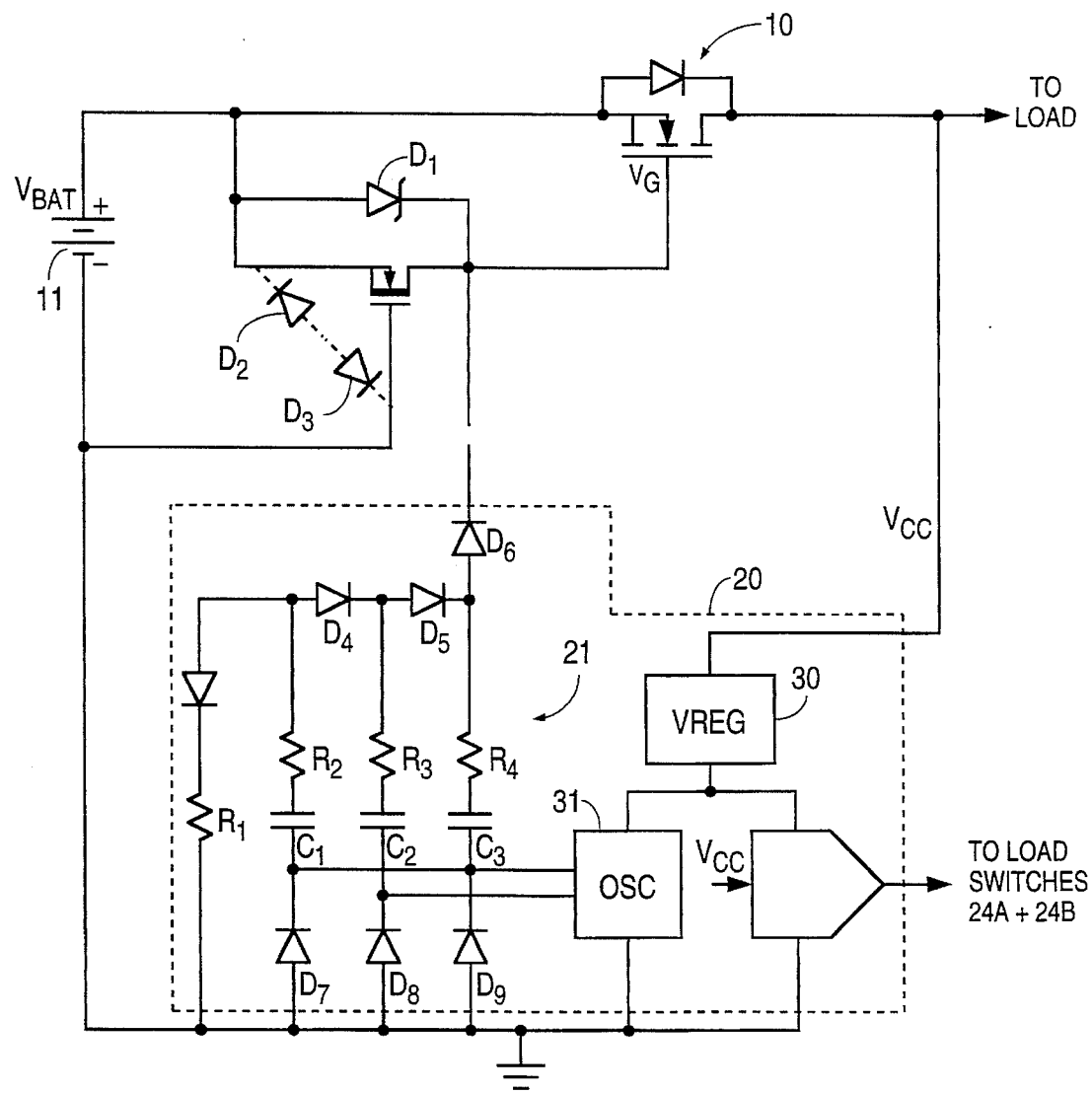
FIG. 3 illustrates a circuit diagram showing the depletion mode MOSFET and the control IC, including the charge pump and other components of the control IC.

FIG. 3 illustrates in greater detail the connection of IC chip 20 and depletion mode MOSFET 23, as well as the components of IC chip 20. The source of depletion mode MOSFET 23 is connected to the positive terminal of battery 11, and the drain of depletion mode MOSFET 23 is connected to an output of charge pump 21, which also leads to the gate of power MOSFET 10. The gate of depletion mode MOSFET 23 is grounded. An intrinsic drain-to-body diode $D_1$ of depletion mode MOSFET 23 is shown. Diode $D_1$ has a breakdown of 20 to 30 V to assure that the $V_{GS}$ of power MOSFET 10 does not exceed its gate voltage rating. Thus diode $D_1$ protects the gate of power MOSFET 10.

Since the gate of depletion mode MOSFET 23 is grounded, during a positive voltage transient its gate-to-source oxide must survive a voltage of 60 V or more. The oxide is therefor designed to survive a 120 V voltage. Accordingly, the thickness of the gate oxide should be greater than 1500 Å; a nominal value of 2000 Å provides adequate protection. The threshold voltage of depletion mode MOSFET 23 can be adjusted to be negative by implanting cesium or another Group I or II element into its gate oxide.

Additional gate protection for depletion mode MOSFET 23 can be obtained by including both P and N-type polysilicon in its gate insulation layer. Diodes $D_2$ and $D_3$ represent fully isolated polysilicon diodes which protect the gate of depletion mode MOSFET 23. Moreover, $D_1$ can be preformed by thinning its epitaxial drain thickness to induce reach through breakdown between its body region and its N+ (drain) substrate, so that the doping concentrations within MOSFET 20 do not require modification to meet a specific maximum breakdown.

When battery 11 is properly connected, the gate-to-source voltage $V_{GS}$ of depletion mode MOSFET 23 is negative (e.g., −16 V) and beyond the pinch-off voltage of the device, which is typically about 8 V. Thus depletion mode MOSFET 23 is turned off and no direct connection is formed between the gate and source of power MOSFET 10. When battery 11 is connected in reverse, however, the $V_{GS}$ of depletion mode MOSFET 23 becomes positive (e.g., +16 V), and the device turns on, shorting the gate and source of power MOSFET 10. This turns power MOSFET 10 off and protects the load.

In the reverse-battery situation, with depletion mode MOSFET 23 turned on, the output of IC chip 20 sees a negative voltage. As shown in FIG. 3, IC chip 20 includes charge pump 21 which is supplied by a voltage regulator 30. Charge pump 21 includes an oscillator 31 and diodes $D_4$, $D_5$ and $D_6$. One output of oscillator 31 is connected to capacitors $C_1$ and $C_3$. The other output of oscillator 31 is connected to a capacitor $C_2$. When the outputs of oscillator 31 provide signals approximately 180° out of phase with each other, in a manner well known in the art charge is transferred in stages from capacitor $C_1$ to capacitor $C_2$ to capacitor $C_3$, and then to the gate of MOSFET 10. Assuming that $V_{BAT}=16V$, charge pump 21 would ordinarily deliver a $V_G \approx 34$ V relative to ground, for a $V_{GS}$ relative to $V_{BAT}$ of about 22 V. Diodes $D_4$–$D_6$ are formed as junction-isolated diodes in IC chip 20, which has a P substrate. The substrate is grounded.

As noted above, when battery 11 is connected in reverse, depletion mode MOSFET 23 acts as a short circuit, and the output of IC chip 20 leading to power MOSFET 10 sees a negative voltage. Ordinarily, this would create serious problems, because, with the N+ cathode of diode $D_6$ negatively biased, minority carriers (electrons) would be injected into the P substrate of IC chip 20. This may cause latch-up, excessive heating or other undesirable effects in IC chip 20. During this condition, when MOSFET 10 is off, $V_{CC}$ collapses slowly toward zero, depending on capacitance and load conditions. $V_{CC}$ does not, however, drop below zero, and therefore does not experience negative voltage.

Figure 4A:
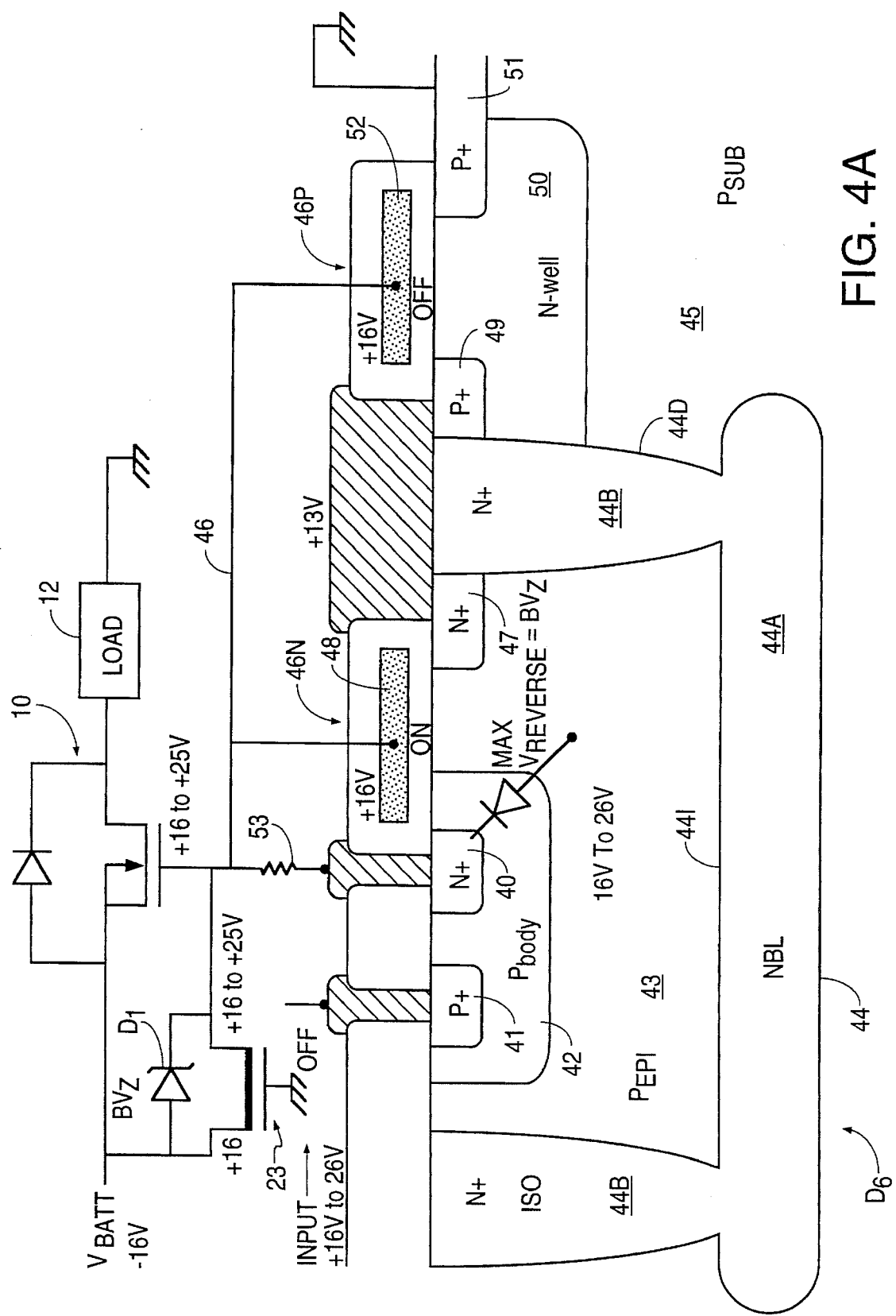
FIG. 4A illustrates a cross-sectional view of a diode in the charge pump, showing schematically how the diode is connected to the power and depletion mode MOSFETs. The voltages indicated are typical voltages that might obtain when the battery is properly connected.

To avoid this problem, diodes $D_4$–$D_6$ are structured as shown in the cross-sectional view of FIG. 4A. As shown, diode $D_6$ includes an N+ cathode 40 and a P+ anode 41, both of which are formed in a P body region 42. The connections of cathode 40 and anode 41 are shown schematically, cathode 40 being connected to the drain of depletion mode MOSFET 23 and the gate of power MOSFET 10, and anode 41 being connected to a resistor $R_4$ and a capacitor $C_3$ associated with the charge pump (see FIG. 3).

P body region 42 is formed in a P epitaxial (epi) region 43 which is surrounded by an N+ isolation region 44. N+ isolation region 44 includes a buried layer 44A and a wraparound region 44B, which together form a "tub" around the diode. N+ isolation region 44 is formed in the P substrate 45 of IC chip 20. Isolation region 44 has an inner junction 44I with P epi region 43 and an outer junction 44O with P substrate 45.

Connected to cathode 40 via a current-limiting resistor 53 is a CMOS inverter 46, which includes an N-channel device 46N and a P-channel device 46P. N-channel device 46N includes N+ cathode 40, an N+ region 47 and a gate 48. P-channel device 46P includes a P+ region 49 formed in an N-well 50 outside of isolation region 44, a second P+ region 51, and a gate 52. The insulation layers of gates 48 and 52 are made thick enough to withstand significant positive or negative gate voltages.

A unique feature of this diode is that, regardless of the common mode voltage at cathode 40, no junction is ever forward-biased into the grounded P substrate 45. Four possible situations are illustrated by the voltages indicated on FIGS. 4A–4D. Taking FIG. 4A initially, battery 11 is connected properly and provides an output of 16 V to the source of power MOSFET 10. Depletion mode MOSFET 23 is therefore turned off. The output of charge pump 21 ranges from about 16 V above ground ($V_{BAT}$) when it is in its low state to about 22 V when it is in its high state. This voltage obtains at the input to diode $D_6$ and throughout P+ anode 41, P body region 42, P epi region 43 and N+ cathode 40. This voltage (less a diode drop of 0.7 V) is also applied to the gate of power MOSFET 10 and to gate 48 of N-channel device 46N, turning that device on and shorting N+ isolation region 44 to cathode 40. Thus isolation region 44 has a voltage in the range 16–25 V, and outer junction 44O with grounded P substrate 45 remains reverse-biased. P-channel device 46P is turned off. Thus, with outer junction 44O of isolation region 44 reverse-biased, no minority carriers are injected into P substrate 45.

Figure 4B:
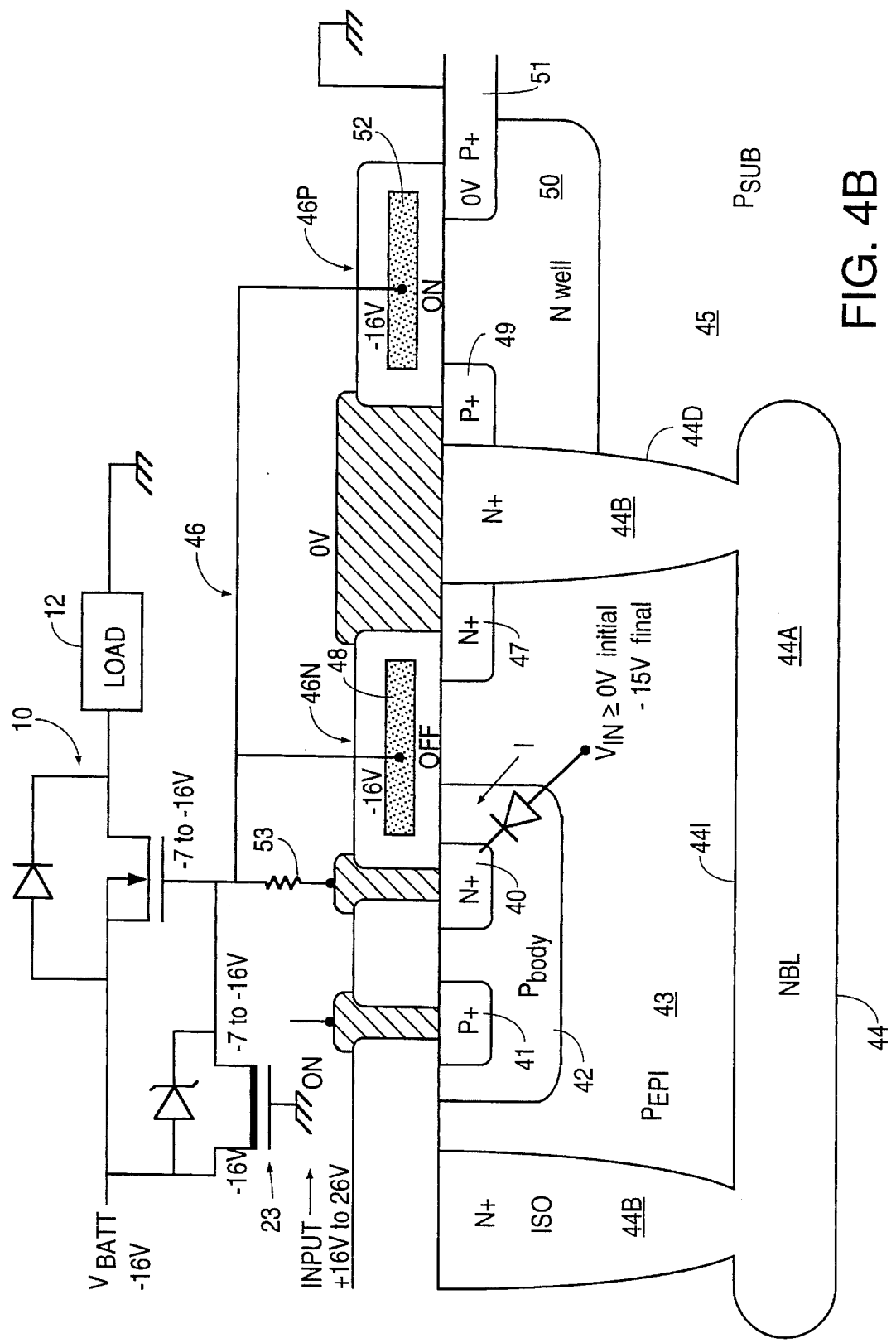
FIGS. 4B–4D are identical to FIG. 4A but show voltages which typically might obtain when the battery is reversed and in the presence of +60 V and −60 V voltage transients.

Suppose battery 11 is connected in reverse. The result is illustrated in FIG. 4B. In this situation, depletion mode MOSFET 23 turns on, shorting the gate of power MOSFET 10 to the output of battery 11 and turning power MOSFET 10 off. The negative voltage at the gate of power MOSFET 10 is also transmitted to N+ cathode 40, which is temporarily forward-biased with respect to P body 42 and P epi 43. If N-channel device 46N remained on, this voltage would also be transmitted to isolation region 44, and outer junction 44O of isolation region 44 would be forward-biased with respect to P substrate 45, resulting in minority carrier injection into the substrate. However, with a voltage of approximately −16 V applied to gates 48 and 52, N-channel device 46N turns off, and P-channel device 46P turns on. This latter action has the effect of grounding isolation region 44. The net result of this is that, after the transient currents have fallen off, P epi region 43 is at a voltage of approximately −15 V and isolation region 44 is grounded. Accordingly, inner junction 44I of isolation region 44 is reverse-biased, and no minority carrier injection into P substrate 45 occurs.

Figure 4C:
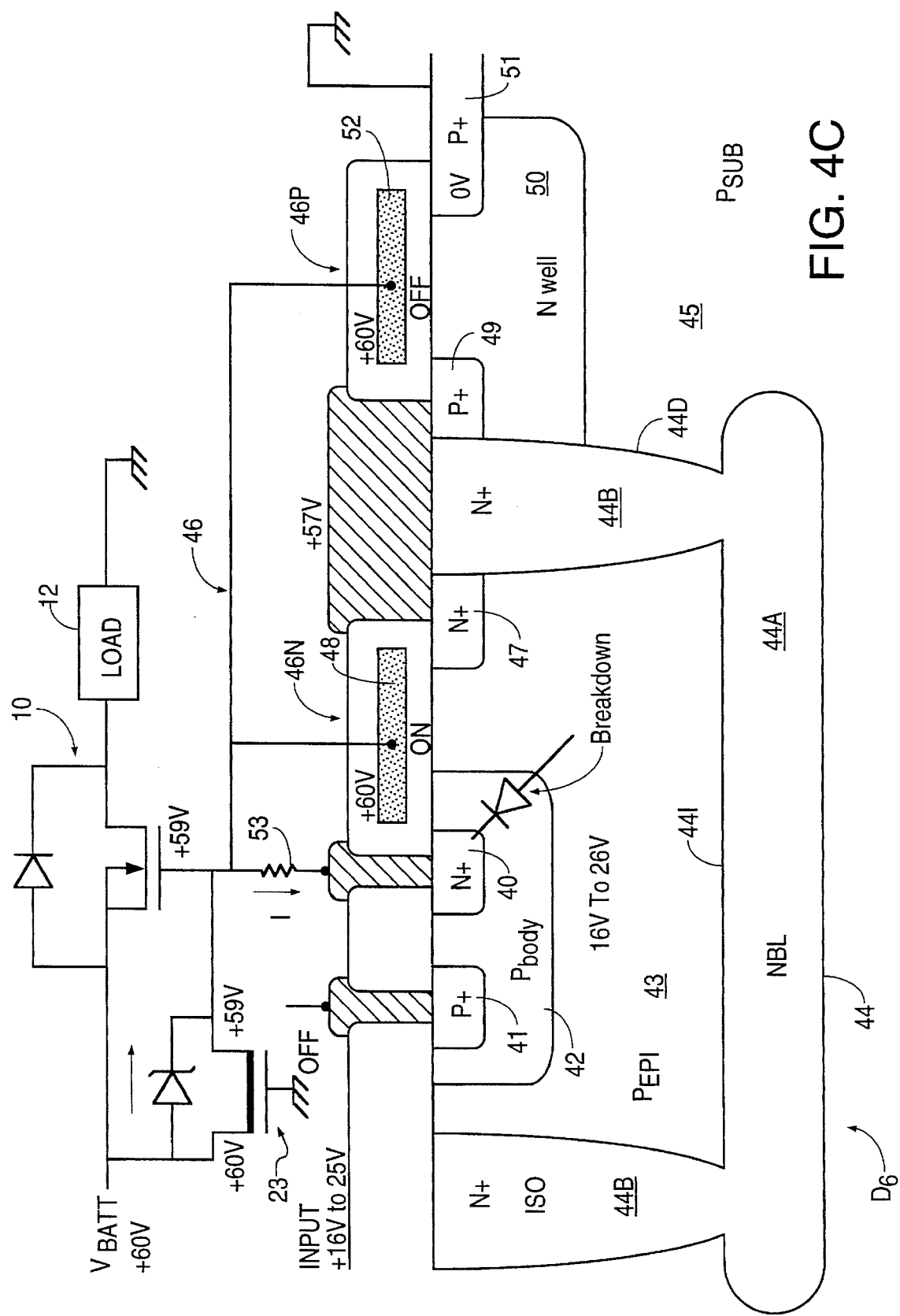
Figure 4D:
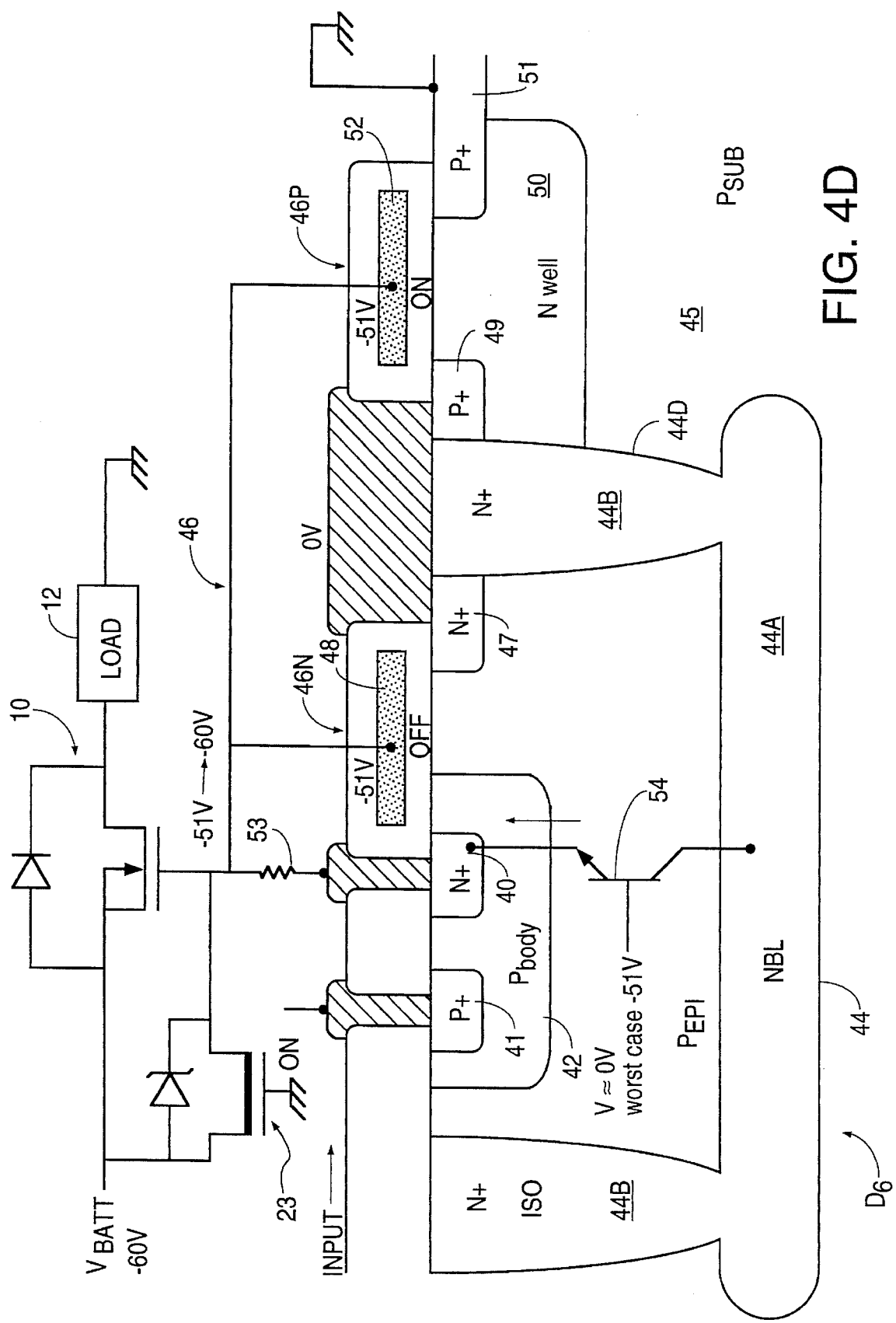

FIGS. 4C and 4D illustrate the circuit in the presence of voltage transients. FIG. 4C illustrates a voltage transient of +60 V. Although depletion mode MOSFET 23 is turned off, intrinsic diode $D_1$ transmits a voltage at essentially the same level to the gate of MOSFET 10 and cathode 40. Since P epi region 43 is still biased in the range of 16 to 25 V, the junction between N+ cathode 40 and P body region 42 is reverse-biased and may experience breakdown. The breakdown voltage of the junction between N+ diode 40 and P body region 42 is typically in the range of 21 V. Since the +60 V voltage spike is of short duration, this breakdown in itself will not create a problem, but it is important to limit the current through the junction so as to avoid damaging the diode. This function is provided by a current-limiting resistor 53 which is connected to cathode 40. As in the case of FIG. 4A, N-channel device 46N is turned on, and outer junction 44O is reverse-biased.

FIG. 4D shows the circuit in the presence of a −60 V transient. P-channel device 46P is turned on, so isolation region 45O is grounded. A parasitic NPPN transistor 54 is formed by isolation region 44, P epi region 43, P body region 42, and N+ cathode 40. Inner junction 44I between isolation region 44 and P epi region 43 is reverse-biased, and the junction between P body region 42 and N+ cathode 40 is forward-biased. The parasitic NPPN transistor operates in its forward active mode and, to avoid snap-back, the current through it is limited by resistor 53. That is, the current density through the parasitic transistor, as limited by resistor 53, must be such that the point where it loses its ability to hold off voltage when it is conducting current (i.e., $BV_{CBO}$ or $LV_{CBO}$) must exceed the level of any negative transient to which the diode is exposed.

Diodes $D_4$ and $D_5$ are constructed in the same manner to avoid the possibility of a forward-biased junction injecting minority carriers into the P substrate. Since the diodes must be capable of withstanding positive and negative voltage transients, the gate insulation layers of N-channel device 46N and P-channel device 46P must be made thick enough to avoid breakdown in these situations.

Essentially, CMOS inverter 46 ties isolation region 44 to whichever is the more positive of cathode 50 and grounded P substrate 45. This insures that inner junction 44I will be reverse-biased when cathode 40 goes negative, and that outer junction 44O will be reverse-biased when cathode 40 goes positive. As a result, minority carrier injection into P substrate 45 is avoided at all times.

Another possible situation occurs where battery 11 is connected properly, but the output of battery 11 drops to, for example, 4 or 5 V. In this situation, the $V_{GS}$ of MOSFET 10 is only in the neighborhood of 8–10 V, and therefore MOSFET 10 is almost turned off. If $V_{GS}$ of MOSFET 10 falls below about 8V, MOSFET 10 will turn off and all of the current will flow through diode 13. This will dissipate a considerable amount of power.

The solution to this problem lies in undervoltage lockout (UVL) circuit 32. UVL circuit 32 monitors the voltage $V_{CC}$ across load 12. When $V_{CC}$ drops below, for example, 6V, UVL circuit 32 sends out a signal which instructs the system to begin shutting off some of the load elements within load 12. It continues to do this until the load current falls to the point where it can be supported by the available driving voltage $V_{GS}$ at the gate of MOSFET 10. Otherwise, with a substantial portion of the current flowing through diode 13, MOSFET 10 will begin to heat up, and this will create a heat dissipation problem. UVL circuit 32 thus acts as a sensing device to determine when $V_{CC}$ is within the "danger region" between 0 and +6 V and where MOSFET 10 is either off or only partially on.

The fabrication of isolation region 44 is described in U.S. Pat. No. 5,156,989, issued Oct. 20, 1992, which is incorporated herein by reference in its entirety. Given an understanding of this patent, the manner of fabricating P+ region 41, N+ region 40 and the remaining components of diode $D_6$ is well known to those of ordinary skill in the art of semiconductor fabrication.

The foregoing embodiments are intended to be illustrative and not limiting. Many additional embodiments in accordance with this invention will be apparent to those skilled in the art. All such additional embodiments are intended to be within the broad principles of this invention, as defined in the following claims.

We claim:

1. A device for protecting a load from a reversed voltage condition, said device comprising:
   an input terminal for connection to a positive terminal of a power source and a load terminal for connection to a load to be supplied by said power source;
   an N-channel MOSFET connected between said input terminal and said load terminal, a source and a body of said MOSFET being coupled to said input terminal and a drain of said MOSFET being coupled to said load terminal;
   a charge pump for increasing the voltage at a gate of said MOSFET to a level above the voltage at said input terminal, said charge pump being supplied by supply circuitry coupled to said load terminal; and
   a depletion mode MOSFET connected between said input terminal and said gate of said N-channel MOSFET.

2. The device of claim 1 wherein said depletion mode MOSFET shorts said gate to said source of said N-channel MOSFET when a reversed voltage is applied to said input terminal.

3. The device of claim 1 wherein a gate of said depletion mode MOSFET is coupled to ground.

4. The device of claim 1 wherein said charge pump is formed in an IC chip and comprises at least one diode, said chip further comprising:
   a substrate of a first conductivity type;
   an isolation region of a second conductivity type, said isolation region enclosing an enclosed region of said substrate, said diode being formed in said enclosed region;
   a first switch connected between said isolation region and a cathode of said diode, said first switch shorting said isolation region to said cathode when a voltage at said cathode exceeds a first predetermined level; and
   a second switch connected between said isolation region and said substrate, said second switch shorting said isolation region to said substrate when a voltage at said cathode falls below a second predetermined level.

5. The device of claim 4 wherein said first and second switches comprise a CMOS inverter.

6. The device of claim 5 wherein said CMOS inverter comprises an N-channel device and a P-channel device, said cathode being connected to a gate of said N-channel device and a gate of said P-channel device.

7. The device of claim 1 further comprising an undervoltage lockout circuit connected to said load terminal of said device, said undervoltage lockout circuit providing a predetermined output signal when the voltage at said load terminal falls below a predetermined voltage level.

8. The device of claim 1 further comprising a battery connected to said input terminal of said device and a load connected to said load terminal of said device.

9. A reverse battery protection device comprising:
   an input terminal for connection to a battery terminal, said input terminal to be connected to a positive terminal of a battery when said battery is properly connected and to a negative terminal of said battery when said battery is reverse connected;
   a load terminal for connection to a load;
   an N-channel MOSFET connected between said input terminal and said load terminal, a body-to-drain diode within said MOSFET being forward directed from said input terminal to said load terminal; and
   a means for setting the voltage at a gate of said MOSFET at a first level above a voltage at said input terminal so as to turn said MOSFET on when said battery is properly connected and for setting the voltage at said gate of said MOSFET at a second level which is below said first level so as to turn said MOSFET off when said battery is reverse connected.

10. The device of claim 9 wherein said means comprises a charge pump.

11. The device of claim 10 wherein said means comprises a means of shorting said gate to said input terminal.

* * * * *